United States Patent
Jung et al.

(10) Patent No.: US 11,393,536 B2
(45) Date of Patent: *Jul. 19, 2022

(54) MEMORY CONTROLLER, MEMORY SYSTEM AND OPERATING METHOD THEREOF

(71) Applicant: SK hynix Inc., Gyeonggi-do (KR)

(72) Inventors: Hoe Seung Jung, Seoul (KR); Joo Young Lee, Seoul (KR)

(73) Assignee: SK hynix Inc., Gyeonggi-do (KR)

( * ) Notice: Subject to any disclaimer, the term of this patent is extended or adjusted under 35 U.S.C. 154(b) by 0 days.

This patent is subject to a terminal disclaimer.

(21) Appl. No.: 17/115,990

(22) Filed: Dec. 9, 2020

(65) Prior Publication Data

US 2021/0090658 A1   Mar. 25, 2021

Related U.S. Application Data

(63) Continuation of application No. 16/212,331, filed on Dec. 6, 2018, now Pat. No. 10,892,014.

(30) Foreign Application Priority Data

Apr. 30, 2018   (KR) .......................... 10-2018-0050194

(51) Int. Cl.
  *G06F 11/00* (2006.01)
  *G11C 16/10* (2006.01)
  (Continued)

(52) U.S. Cl.
  CPC .......... *G11C 16/10* (2013.01); *G11C 16/3459* (2013.01); *G11C 29/04* (2013.01); *G06F 11/1402* (2013.01); *G11C 16/0483* (2013.01)

(58) Field of Classification Search
  CPC . G11C 16/10; G11C 16/3436; G11C 16/3454; G11C 16/3459; G11C 29/00;
  (Continued)

(56) References Cited

U.S. PATENT DOCUMENTS 10,019,332 B1 *   7/2018   Sehgal .................. G11C 16/10
10,108,506 B2 *  10/2018   Park .................... G06F 11/0751
(Continued)

FOREIGN PATENT DOCUMENTS

KR   10-2010-0091379 A   8/2010

OTHER PUBLICATIONS

Office Action issued by the Korean Intellectual Property Office dated Feb. 21, 2022.

*Primary Examiner* — Marc Duncan
(74) *Attorney, Agent, or Firm* — IP & T Group LLP

(57) ABSTRACT

In a memory controller included in a memory system for processing a program operation fail, the memory controller controls a plurality of memory devices commonly coupled to a channel, the plurality of memory devices respectively performing preset program operations, and includes: a buffer memory for storing data to be stored in the plurality of memory devices, based on a buffer memory index; and a program error processor for acquiring fail data corresponding to a program operation fail from a fail memory device and acquiring reprogram data that is data to be stored together with the fail data, based on the buffer memory index.

19 Claims, 12 Drawing Sheets

(51) Int. Cl.
*G11C 16/34* (2006.01)
*G11C 29/04* (2006.01)
*G11C 16/04* (2006.01)
*G06F 11/14* (2006.01)

(58) Field of Classification Search
CPC .. G06F 11/1402; G06F 11/141; G06F 11/073;
G06F 11/0793
See application file for complete search history.

(56) References Cited

U.S. PATENT DOCUMENTS

| | | | | |
|---|---|---|---|---|
| 2010/0205517 A1* | 8/2010 | Lee | ............... | G06F 11/0727 |
| | | | | 714/807 |
| 2011/0271041 A1* | 11/2011 | Lee | ............... | G06F 12/0868 |
| | | | | 711/103 |
| 2014/0215122 A1* | 7/2014 | Li | ............... | G06F 11/1666 |
| | | | | 711/103 |
| 2017/0123991 A1* | 5/2017 | Sela | ............... | G11C 16/102 |

* cited by examiner

MEMORY CONTROLLER, MEMORY SYSTEM AND OPERATING METHOD THEREOF

CROSS-REFERENCE TO RELATED APPLICATION

This application is a continuation of U.S. patent application Ser. No. 16/212,331 filed on Dec. 6, 2018, which claims benefits of priority of Korean Patent Application No. 10-2018-0050194 filed on Apr. 30, 2018. The disclosure of each of the foregoing application is incorporated herein by reference in its entirety.

BACKGROUND

1. Field of Invention

The present invention disclosure generally relates to an electronic device, and more particularly, to a memory system and an operating method thereof.

2. Description of Related Art

Generally, a storage system may store data under the control of a host device such as a computer, a smart phone or a smart pad. A storage system may include a device for storing data (also referred to generally as a storage device) on a magnetic disk, such as a hard disk drive (HDD), or a device for storing data on a semiconductor memory (also referred to as a memory device), e.g., a nonvolatile memory device, such as a solid state drive (SSD) or a memory card. A semiconductor based storage system employing a memory device is referred to herein as a memory system.

A memory system may include, in addition to a memory device for storing the data, a memory system controller (referred to hereinafter simply as memory controller) for controlling the memory device. The memory controller may control the flow of data and control signals between the memory device and the host. A memory device may be classified into a volatile memory device and a nonvolatile memory device. Examples of a nonvolatile memory device may include a read only memory (ROM), a programmable ROM (PROM), an electrically programmable ROM (EPROM), an electrically erasable and programmable ROM (EEPROM), a flash memory, a phase-change RAM (PRAM), a magnetic RAM (MRAM), a resistive RAM (RRAM), a ferroelectric RAM (FRAM), and the like.

SUMMARY

Embodiments of the present invention relate generally to a memory controller, a memory system employing the memory controller and a method of operation thereof for processing a program operation.

In accordance with an aspect of the present invention disclosure, there is provided a memory controller for controlling a plurality of memory devices commonly coupled to a channel, the plurality of memory devices respectively performing preset program operations, the memory controller including: a buffer memory configured to store data to be stored in the plurality of memory devices, based on a buffer memory index; and a program error processor configured to acquire fail data corresponding to a program operation fail from a fail memory device and acquire reprogram data that is data to be stored together with the fail data, based on the buffer memory index.

In accordance with another aspect of the present invention disclosure, there is provided a method for operating a memory controller for controlling a plurality of memory devices commonly coupled to a channel, the plurality of memory devices respectively performing preset program operations, the method including: detecting a program operation fail, which has occurred in any one memory device among the plurality of memory devices; acquiring fail data as data stored in a fail memory device; acquiring reprogram data as data to be stored together with the fail data; and storing the fail data and the reprogram data in the plurality of memory devices.

In accordance with an aspect of the present invention disclosure, there is provided a memory system, the memory system including a plurality of memory devices commonly coupled to a channel, suitable for performing program operations based on an interleaving scheme; and a memory controller suitable for: detecting a fail memory device having a program operation fail; holding the program operations for the plurality of memory devices; acquiring fail data corresponding to the program operation fail from the fail memory device; performing reprogram operations for remaining memory devices excluding the fail memory device; acquiring reprogram data corresponding to the reprogram operations from the remaining memory devices; and performing a reprogram operation for the fail memory device to store the fail data and the reprogram data in the fail memory device.

These and other features and advantages of the present invention will become apparent to those skilled in the art of the invention from the following detailed description in conjunction with the following drawings.

BRIEF DESCRIPTION OF THE DRAWINGS

Example embodiments of the invention will now be described more fully hereinafter with reference to the accompanying drawings; however, it is noted that the invention may be embodied in different forms and should not be construed as limited only to the embodiments set forth herein. Rather, these embodiments are provided so that this disclosure will be thorough and complete, and will fully convey the scope of the invention to those skilled in the art to which the invention belongs or pertains.

In the drawings, dimensions may be exaggerated for clarity of illustration. It will also be understood that when an element is referred to as being "between" two elements, it can be the only element between the two elements, or one or more intervening elements may also be present. Like reference numerals refer to like elements throughout.

DETAILED DESCRIPTION

Figure 1:
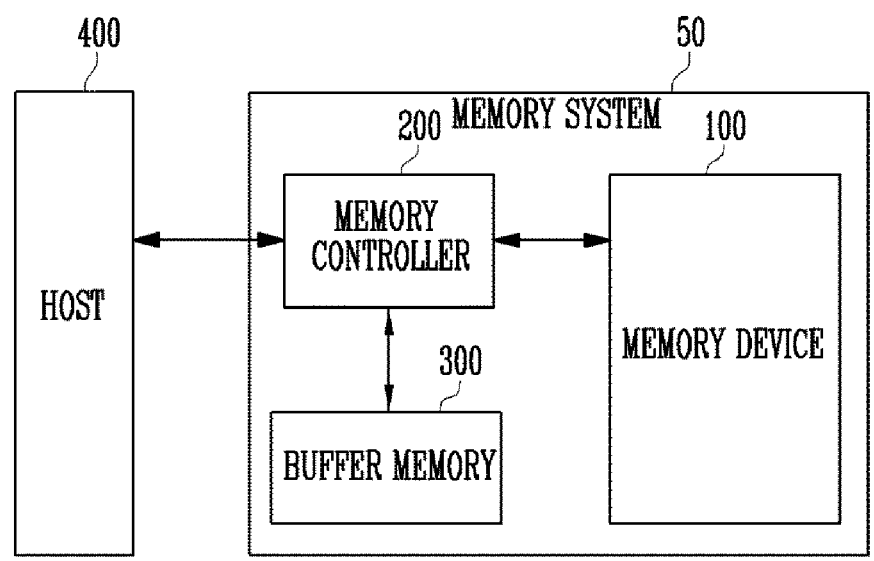
FIG. 1 is a block diagram illustrating a memory system operatively coupled to a host, in accordance with an embodiment of the present invention disclosure.

It is noted that the specific structural and/or functional description of the present invention disclosed herein is merely illustrative for the purpose of describing various embodiments in accordance with the concept of the present invention. Thus, the concepts of the present invention may also be implemented in various other forms, and may not be construed as limited only to the embodiments set forth herein.

Also, we note that the described embodiments may be variously modified and may have various other configurations in agreement with the concepts of the present invention.

Various exemplary embodiments of the invention are schematically illustrated in the drawings and are described herein in detail for the purpose of disclosing the invention to those having ordinary skill in the art to which the invention belongs or pertains. However, the invention and its various embodiments in accordance with the concepts of the present invention should not be construed as limited to the specified disclosures, and may include all changes, equivalents, or substitutes that do not depart from the spirit and technical scope of the present invention.

While terms such as "first" and "second" may be used to describe various components, such components must not be understood as being limited to the above terms. The above terms are used only to distinguish one component from another. For example, a first component may be referred to as a second component without departing from the scope of rights of the present invention disclosure, and likewise a second component may be referred to as a first component.

It will be understood that when an element is referred to as being "connected" or "coupled" to another element, it can be directly connected or coupled to the other element or intervening elements may also be present. In contrast, when an element is referred to as being "directly connected" or "directly coupled" to another element, no intervening elements are present. Meanwhile, other expressions describing relationships between components such as "~ between," "immediately ~ between" or "adjacent to ~" and "directly adjacent to ~" may be construed similarly.

The terms used in the present application are merely used to describe particular embodiments, and are not intended to limit the present invention disclosure. Singular forms in the present invention disclosure are intended to include the plural forms as well, unless the context clearly indicates otherwise. It will be further understood that terms such as "including" or "having," etc., are intended to indicate the existence of the features, numbers, operations, actions, components, parts, or combinations thereof disclosed in the specification, and are not intended to preclude the possibility that one or more other features, numbers, operations, actions, components, parts, or combinations thereof may exist or may be added.

So far as not being differently defined, all terms used herein including technical or scientific terminologies have meanings that they are commonly understood by those skilled in the art employing a present invention disclosure pertains. The terms having the definitions as defined in the dictionary should be understood such that they have meanings consistent with the context of the related technique. So far as not being clearly defined in this application, terms should not be understood in an ideally or excessively formal way.

In describing those embodiments, description will be omitted for techniques that are well known to the art employing a present invention disclosure pertains, and are not directly related to the present invention disclosure. This intends to disclose the gist of the present invention disclosure more clearly by omitting unnecessary description.

Hereinafter, exemplary embodiments of the present invention disclosure will be described in detail with reference to the accompanying drawings in order for those skilled in the art to be able to readily implement the technical spirit of the present invention disclosure.

FIG. 1 is a block diagram illustrating a memory system 50 in accordance with an embodiment of the present invention disclosure.

Referring to FIG. 1, the memory system 50 may include a memory device 100, a memory controller 200, and a buffer memory 300.

The memory system 50 may store data under the control of a host 400, such as a mobile phone, a smart phone, an MP3 player, a laptop computer, a desktop computer, a game console, a television (TV), a tablet personal computer (PC) or an in-vehicle infotainment.

The memory system 50 may be implemented as any one of various types of memory systems employing various host interface communication schemes with the host 400. For example, the memory system 50 may be implemented with any one of various types of memory systems such as a memory system of a solid state drive (SSD), a multi-media card (MMC), an embedded MMC (eMMC), a reduced size MMC (RS-MMC), a micro-MMC type multi-media card, a secure digital (SD), a mini-SD and a micro-SD type secure digital card, a universal serial bus (USB), a universal flash storage (UFS) device, a personal computer memory card international association (PCMCIA) card, a peripheral component interconnection (PCI) card, a PCI Express (PCI-e or PCIe) card, a compact flash (CF) card, a smart media card, and a memory stick.

The memory system 50 may be implemented as any one of various kinds of package types. For example, the memory system 50 may be implemented as any one of various kinds of package types such as a package-on-package (POP), a system-in-package (SIP), a system-on-chip (SOC), a multichip package (MCP), a chip-on-board (COB), a wafer-level fabricated package (WFP), and a wafer-level stack package (WSP).

The memory device 100 may store data. The memory device 100 may operate under the control of the memory controller 200. The memory device 100 may include a memory cell array including a plurality of memory cells for storing data. The memory cell array may include a plurality of memory blocks. Each memory block may include a plurality of memory cells. One memory block may include a plurality of pages. In some embodiments, the page may be a unit for storing data or reading data stored in the memory device 100. The memory block may be a unit for erasing data. In an embodiment, the memory device 100 may be a double data rate synchronous dynamic random access memory (DDR SDRAM), a low power double data rate 4 (LPDDR4) SDRAM, a graphics double data rate (GDDR) SRAM, a low power DDR (LPDDR), a Rambus dynamic random access memory (RDRAM), a NAND flash memory, a vertical NAND flash memory, a NOR flash memory, a resistive random access memory (RRAM or ReRAM), a phase-change random access memory (PRAM), a magnetoresistive random access memory (MRAM), a ferroelectric random access memory (FRAM), a spin transfer torque random access memory (STT-RAM), or the like. In this specification, for convenience, a case where the memory device 100 is a NAND flash memory described in more detail as an example.

In an embodiment, the memory device 100 may be implemented in a three-dimensional (3D) array structure. The present invention disclosure may be applied to not only a flash memory device in which a charge storage layer is configured with a floating gate (FG) but also a charge trap flash (CTF) in which a charge storage layer is configured with an insulating layer.

In an embodiment, each of the memory cells included in the memory device 100 may be configured as a single level cell (SLC) for storing one data bit. Alternatively, each of the memory cells included in the memory device 100 may be configured as a multi-level cell (MLC) for storing two data bits, a triple level cell (TLC) for storing three data bits, or a quad level cell (QLC) for storing four data bits.

The memory device 100 is configured to receive a command and an address from the memory controller 200 and access an area selected by the address in the memory cell array. That is, the memory device 100 may perform an operation corresponding to the command on the area selected by the address. For example, the memory device 100 may perform a write (or program) operation, a read operation, and an erase operation. In the program operation, the memory device 100 may program data in the area selected by the address. In the read operation, the memory device 100 may read data from the area selected by the address. In the erase operation, the memory device 100 may erase data stored in the area selected by the address.

The memory controller 200 may control an operation of the memory system 50.

When power is applied to the memory system 50, the memory controller 200 may execute firmware (FW) for controlling a communication between the host 400 and the memory device 100. For example, when the memory device 100 is a flash memory device, the memory controller 200 may execute FW known as a flash translation layer (FTL) for controlling a communication between the host 400 and the memory device 100.

In an embodiment, the memory controller 200 may receive data and a logical block address (LBA) from the host 400, and translate the LBA into a physical block address (PBA) representing addresses of memory cells included in the memory device 100, in which data is stored. The memory controller 200 may store, in the buffer memory 300, logical-physical address mapping information that establishes a mapping relationship between the LBA and the PBA.

The memory controller 200 may control the memory device 100 to perform a program operation, a read operation, an erase operation, or the like in response to a request from the host 400. In the program operation, the memory controller 200 may provide a program command, a PBA, and data to the memory device 100. In the read operation, the memory controller 200 may provide a read command and a PBA to the memory device 100. In the erase operation, the memory controller 200 may provide an erase command and a PBA to the memory device 100.

In an embodiment, the memory controller 200 may autonomously generate a program command, an address, and data without any request from the host 400, and transmit the program command, the address, and the data to the memory device 100. For example, the memory controller 200 may provide the command, the address, and the data to the memory device 100 to perform background operations such as a wear leveling operation and a garbage collection operation.

In an embodiment, the memory controller 200 may control data exchange between the host 400 and the buffer memory 300. Alternatively, the memory controller 200 may temporarily store system data for controlling the memory device 100 in the buffer memory 300. For example, the memory controller 200 may temporarily store data received from the host 400 in the buffer memory 300, and then transmit the data temporarily stored in the buffer memory 300 to the memory device 100.

In various embodiments, the buffer memory 300 may be used as a working memory or cache memory of the memory controller 200. The buffer memory 300 may store codes or commands, which are executed by the memory controller 200. The buffer memory 300 may store data processed by the memory controller 200.

In an embodiment, the buffer memory 300 may be implemented with a dynamic random access memory (DRAM) such as a double data rate synchronous DRAM (DDR SDRAM), a low power double data rate4 (LPDDR4) SDRAM, a graphics double data rate (GDDR) SDRAM, a low power DDR (LPDDR) or a Rambus dynamic random access memory (RDRAM), or a static random access memory (SRAM).

In various embodiments, the memory system 50 may not include the buffer memory 300 but instead an external volatile memory device, i.e., a volatile memory device provided outside of the memory system 50 may serve as the buffer memory 300.

In various embodiments, the buffer memory 300 may be included in the memory controller 200.

The memory controller 200 may control at least two memory devices 100. The memory controller 200 may control the memory devices 100 according to an interleaving scheme so as to improve operational performance.

The host 400 may communicate with the memory system 50, using at least one of various communication schemes, such as a universal serial bus (USB), a serial AT attachment (SATA), a high speed interchip (HSIC), a small computer system interface (SCSI), Firewire, a peripheral component interconnection (PCI), a PCI express (PCIe or PCIe), a nonvolatile memory express (NVMe), a universal flash storage (UFS), a secure digital (SD), a multi-media card (MMC), an embedded MMC (eMMC), a dual in-line memory module (DIMM), a registered DIMM (RDIMM), and a load reduced DIMM (LRDIMM).

Figure 2:
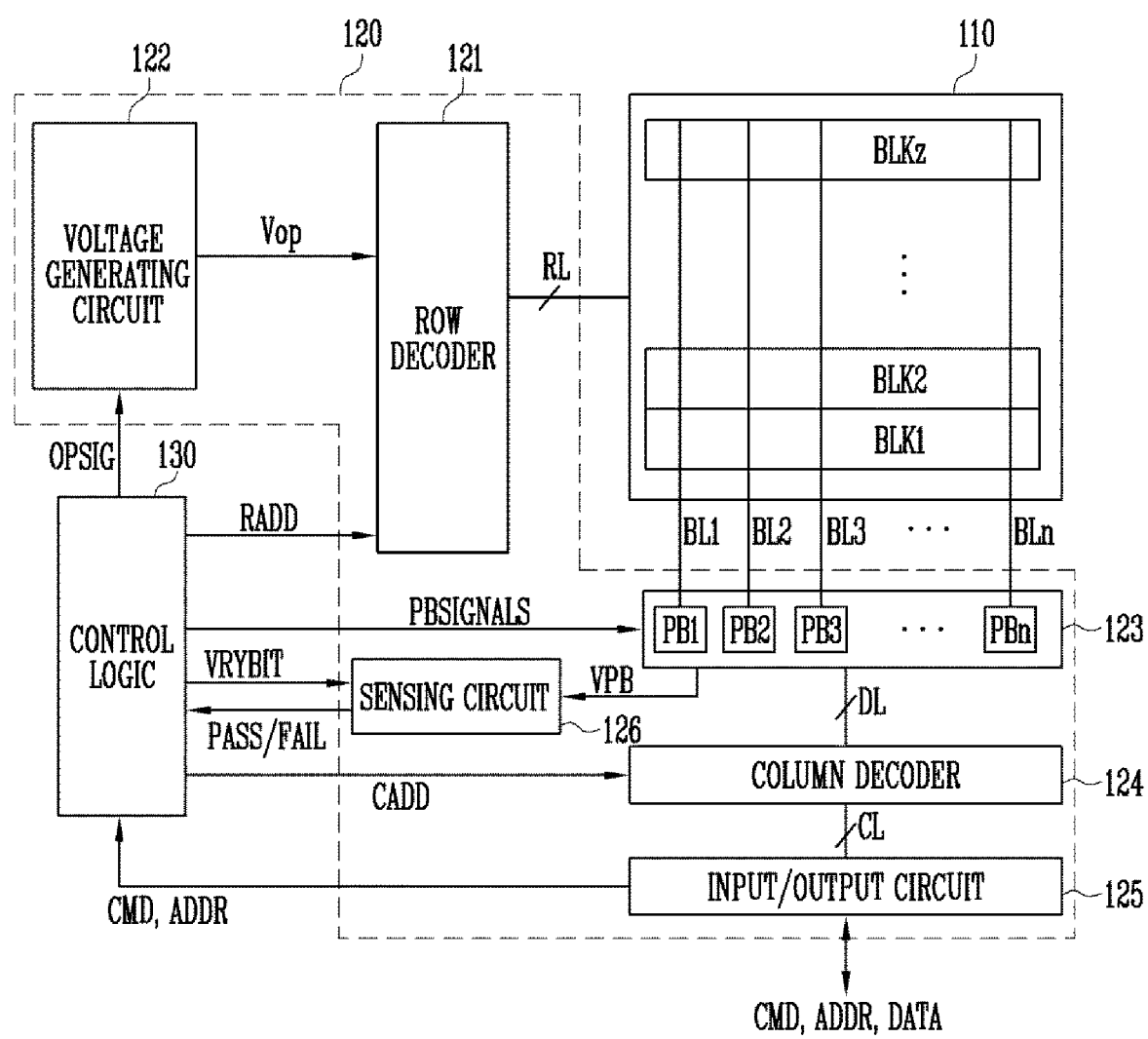
FIG. 2 is a diagram illustrating a configuration of a memory device, in accordance with an embodiment of the present invention disclosure.

FIG. 2 is a diagram illustrating a memory device in accordance with an embodiment of the present invention disclosure, for example, the memory device 100 of FIG. 1.

Referring to FIG. 2, the memory device 100 may include a memory cell array 110, a peripheral circuit 120, and a control logic 130.

The memory cell array 110 may include a plurality of memory blocks, for example, memory blocks BLK1 to BLKz. The plurality of memory blocks BLK1 to BLKz may be coupled to a row decoder 121 through row lines RL. The plurality of memory blocks BLK1 to BLKz may be coupled to a page buffer group 123 through bit lines BL1 to BLn. Each of the plurality of memory blocks BLK1 to BLKz may include a plurality of memory cells. In an embodiment, the plurality of memory cells are nonvolatile memory cells. Memory cells coupled to the same word line may be defined as one page. Therefore, one memory block may include a plurality of pages.

The row lines RL may include at least one source select line, a plurality of word lines, and at least one drain select line, for each memory block.

Each of the memory cells included in the memory cell array 110 may be configured as a single level cell (SLC) for storing one bit of data. Also, each of the memory cells included in the memory device 100 may be configured as a multi-level cell (MLC) for storing two bits of data, a triple level cell (TLC) for storing three bits of data, or a quad level cell (QLC) for storing four bits of data.

The peripheral circuit 120 may be configured to perform a program operation, a read operation or an erase operation in a selected area of the memory cell array 110 under the control of the control logic 130. The peripheral circuit 120 may drive the memory cell array 110. For example, the peripheral circuit 120 may apply various operating voltages to the row lines RL and the bit lines BL1 to BLn under the control of the control logic 130, or discharge the applied voltages.

The peripheral circuit 120 may include the row decoder 121, a voltage generating circuit 122, the page buffer group 123, a column decoder 124, and an input and output (input/output) circuit 125.

The row decoder 121 is coupled to the memory cell array through the row lines RL. The row lines RL may include at least one source select line, a plurality of word lines, and at least one drain select line. In an embodiment, the word lines may include normal word lines and dummy word lines. In an embodiment, the row lines RL may further include a pipe select line.

The row decoder 121 may operate under the control of the control logic 130. The row decoder 121 receives a row address RADD from the control logic 130.

The row decoder 121 is configured to decode the row address RADD. The row decoder 121 selects at least one memory block among the memory blocks BLK1 to BLKz according to the decoded address. Also, the address decoder 121 may select at least one word line of the selected memory block to apply voltages Vop generated by the voltage generating circuit 122 to at least one word line WL according to the decoded address.

In a program operation, the row decoder 121 may apply a program voltage to the selected word line, and apply a program pass voltage having a level less than that of the program voltage to unselected word lines. In a program verify operation, the row decoder 121 may apply a verify voltage to the selected word line, and apply a verify pass voltage greater than the verify voltage to the unselected word lines. In a read operation, the row decoder 121 may apply a read voltage to the selected word line, and apply a read pass voltage greater than the read voltage to the unselected word lines.

In an embodiment, an erase operation of the memory device 100 is performed in units of memory blocks. In the erase operation, the row decoder 121 may select one memory block according the decoded address. In the erase operation, the row decoder 121 may apply a ground voltage to word lines coupled to the selected memory block.

The voltage generating circuit 122 may operate under the control of the control logic 130. The voltage generating circuit 122 may generate a plurality of voltages Vop by using an external power voltage supplied to the memory device 100. Specifically, the voltage generating circuit 122 may generate various operating voltages Vop used for program, read, and erase operation in response to an operation signal OPSIG from the control logic 130. For example, the voltage generating circuit 122 generates a program voltage, a verify voltage, a pass voltage, a read voltage, an erase voltage, and the like under the control of the control logic 130.

In an embodiment, the voltage generating circuit 122 may generate an internal power voltage by regulating the external power voltage. The internal power voltage generated by the voltage generating circuit 122 is used as an operation voltage of the memory device 100.

In an embodiment, the voltage generating circuit 122 may generate a plurality of voltages by using the external power voltage or the internal power voltage.

For example, the voltage generating circuit 122 includes a plurality of pumping capacitors for receiving the internal power voltage, and generate a plurality of voltages by selectively activating the plurality of pumping capacitors under the control of the control logic 130.

The plurality of generated voltages may be supplied to the memory cell array 110 by the row decoder 121.

The page buffer group 123 may include a plurality of page buffers, for example, first to nth page buffers PB1 to PBn. The first to nth page buffers PB1 to PBn are coupled to the memory cell array 110 respectively through the first to nth bit lines BL1 to BLn. The first to nth page buffers PB1 to PBn operate under the control of the control logic 130. Specifically, the first to nth page buffers PB1 to PBn may operate in response to page buffer control signals PBSIG-NALS from the control logic 130. For example, the first to nth page buffers PB1 to PBn temporarily stores data received through the first to nth bit lines BL1 to BLn, or senses voltages or currents of the bit lines BL1 to BLn in a read or verify operation.

Specifically, in a program operation, the first to nth page buffers PB1 to PBn may transfer, to selected memory cells, data received through the input/output circuit 125, when a program voltage is applied to a selected word line. The memory cells of the selected page may be programmed according to the transferred data DATA. A memory cell coupled to a bit line to which a program allowable voltage (e.g., a ground voltage) is applied may have an increased threshold voltage. The threshold voltage of a memory cell coupled to a bit line to which a program inhibit voltage (e.g., a power supply voltage) is applied may be maintained. In a program verify operation, the first to nth page buffers PB1 to PBn read page data from the selected memory cells through the bit lines BL1 to BLn.

In a read operation, the first to nth page buffers PB1 to PBn may read data DATA from memory cells of a selected page through the first to nth bit lines BL1 to BLn, and output the read data DATA to the input/output circuit 125 under the control of the column decoder 124.

In an erase operation, the first to nth page buffers PB1 to PBn may float the first to nth bit lines BL1 to BLn.

The column decoder 124 may transfer data between the input/output circuit 125 and the page buffer group 123 in response to a column address CADD from the control logic 130. For example, the column decoder 124 exchanges data with the first to nth page buffers PB1 to PBn through data lines DL, or exchanges data with the input/output circuit 125 through column lines CL.

The input/output circuit 125 may transfer a command CMD and an address ADDR, which are received from the memory controller 200 described with reference to FIG. 1, to the control logic 130, or exchange data DATA with the column decoder 124.

In a read operation or a verify operation, a sensing circuit 126 may generate a reference current in response to an allowable bit signal VRYBIT from the control logic 130, and output a pass signal PASS or a fail signal FAIL to the control logic 130 by comparing a sensing voltage VPB received from the page buffer group 123 with a reference voltage generated by the reference current.

The control logic 130 may control the peripheral circuit 120 by outputting the operation signal OPSIG, the row address RADD, the page buffer control signals PBSIG-NALS, and the allowable bit signal VRYBIT in response to the command CMD and the address ADDR. Also, the control logic 130 may determine whether the verify operation has passed or failed in response to the pass or fail signal PASS or FAIL.

Figure 3:
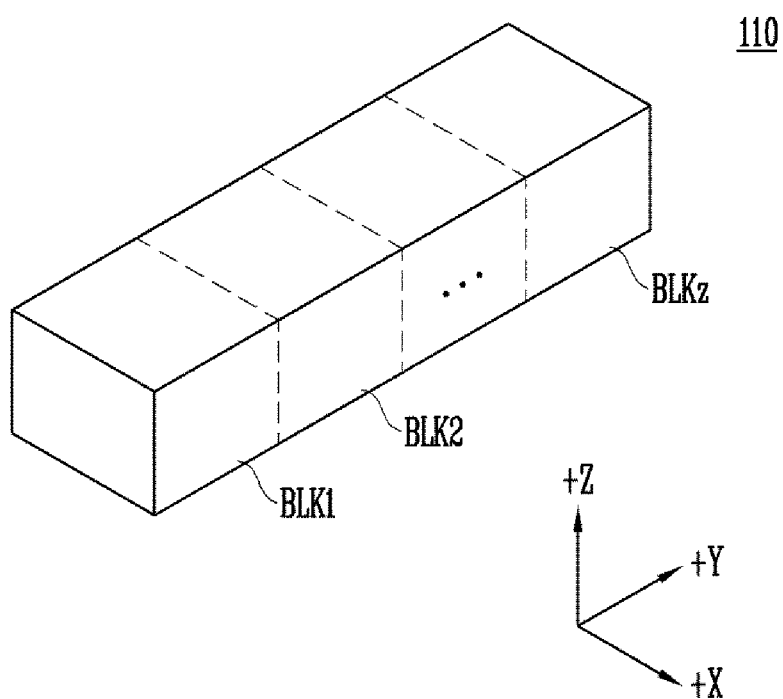
FIG. 3 is a diagram illustrating a three-dimensional memory cell array, in accordance with an embodiment of the present invention disclosure.

FIG. 3 is a diagram illustrating a memory cell array in accordance with an embodiment of the present invention disclosure, for example, the memory cell array 110 of FIG. 2.

Referring to FIG. 3, the memory cell array 110 may include a plurality of memory blocks BLK1 to BLKz. Each memory block may have a three-dimensional (3D) structure. Each memory block may include a plurality of memory cells stacked on a substrate (not shown). The plurality of memory cells may be arranged along +X, +Y, and +Z directions. A structure of each memory block will be described in more detail with reference to FIGS. 4 and 5.

Figure 4:
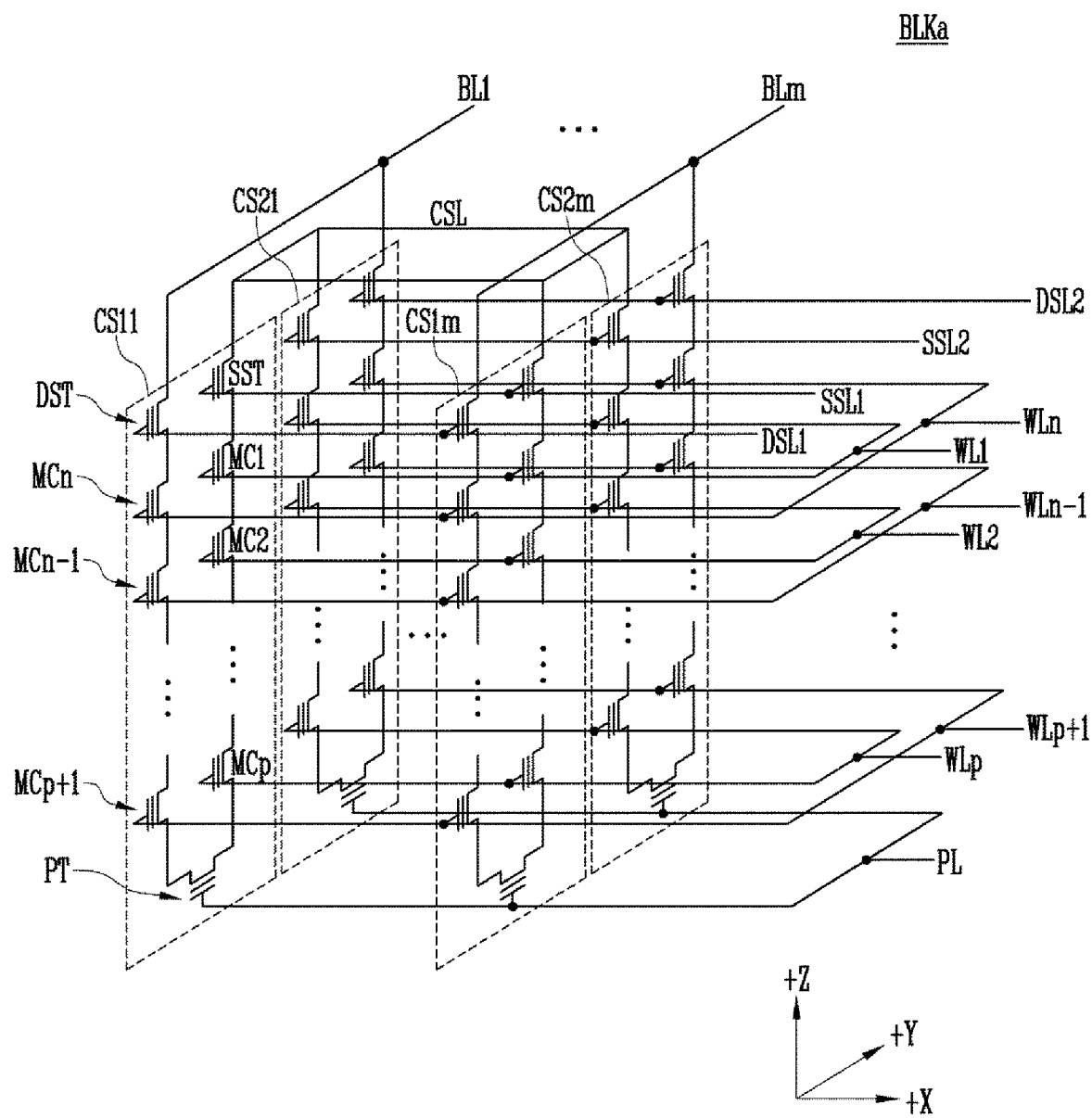
FIG. 4 is a circuit diagram illustrating a memory block, in accordance with an embodiment of the present invention disclosure.

FIG. 4 is a circuit diagram illustrating an example of a memory block in accordance with an embodiment of the present invention disclosure, for example, a memory block BLKa among the memory blocks BLK1 to BLKz of FIG. 3.

Referring to FIG. 4, the memory block BLKa may include a plurality of cell strings CS11 to CS1$m$ and CS21 to CS2$m$. In an embodiment, each of the plurality of cell strings CS11 to CS1$m$ and CS21 to CS2$m$ may be formed in a 'U' shape. In the memory block BLKa, m cell strings are arranged in a row direction (i.e., a +X direction). Although FIG. 4 illustrates two cell strings arranged in a column direction (i.e., a +Y direction), the present invention disclosure is not limited thereto. That is, illustrations of FIG. 4 are for convenience of description, and it will be understood that three cell strings may be arranged in the column direction.

Each of the plurality of cell strings CS11 to CS1$m$ and CS21 to CS2$m$ may include at least one source select transistor SST, first to nth memory cells MC1 to MCn, a pipe transistor PT, and at least one drain select transistor DST.

The select transistors SST and DST and the memory cells MC1 to MCn may have structures similar to one another. In an embodiment, each of the select transistors SST and DST and the memory cells MC1 to MCn may include a channel layer, a tunneling insulating layer, a charge storage layer, and a blocking insulating layer. In an embodiment, a pillar for providing the channel layer may be provided in each cell string. In an embodiment, a pillar for providing at least one of the channel layer, the tunneling insulating layer, the charge storage layer, and the blocking insulating layer may be provided in each cell string.

The source select transistor SST of each cell string is coupled between a common source line CSL and memory cells MC1 to MCp.

In an embodiment, the source select transistors of cell strings arranged on the same row are coupled to a source select line extending in the row direction, and the source select transistors of cell strings arranged on different rows are coupled to different source select lines. In FIG. 4, the source select transistors of the cell strings CS11 to CS1$m$ on a first row are coupled to a first source select line SSL1. The source select transistors of the cell strings CS21 to CS2$m$ on a second row are coupled to a second source select line SSL2.

In another embodiment, the source select transistors of the cell strings CS11 to CS1$m$ and CS21 to CS2$m$ may be commonly coupled to one source select line.

The first to nth memory cells MC1 to MCn of each cell string are coupled between the source select transistor SST and the drain select transistor DST.

The first to nth memory cells MC1 to MCn may be divided into first to pth memory cells MC1 to MCp and a (p+1)th to nth memory cells MCp+1 to MCn. The first to pth memory cells MC1 to MCp are sequentially arranged in the opposite direction of a +Z direction, and are coupled in series between the source select transistor SST and the pipe transistor PT. The (p+1)th to nth memory cells MCp+1 to MCn are sequentially arranged in the +Z direction, and are coupled in series between the pipe transistor PT and the drain select transistor DST. The first to pth memory cells MC1 to MCp and the (p+1)th to nth memory cells MCp+1 to MCn are coupled through the pipe transistor PT. Gate electrodes of the first to nth memory cells MC1 to MCn of each cell string are coupled to first to nth word lines WL1 to WLn, respectively.

A gate of the pipe transistor PT of each cell string is coupled to a pipe line PL.

The drain select transistor DST of each cell string is coupled between a corresponding bit line and the memory cells MCp+1 to MCn. Cell strings arranged in the row direction are coupled to a drain select line extending in the row direction. The drain select transistors of the cell strings CS11 to CS1$m$ on the first row are coupled to a first drain select line DSL1. The drain select transistors of the cell strings CS21 to CS2$m$ on the second row are coupled to a second drain select line DSL2.

Cell strings arranged in the column direction are coupled to a bit line extending in the column direction. In FIG. 4, the cell strings CS11 and CS21 on a first column are coupled to a first bit line BL1. The cell strings CS1$m$ and CS2$m$ on an mth column are coupled to an mth bit line BLm.

Memory cells coupled to the same word line in the cell strings arranged in the row direction constitute one page. For example, memory cells coupled to the first word line WL1 in the cell strings CS11 to CS1$m$ on the first row constitute one page. Memory cells coupled to the first word line WL1 in the cell strings CS21 to CS2$m$ on the second row constitute another page. As any one of the drain select lines DSL1 and DSL2 is selected, cell strings arranged in one row direction may be selected. As any one of the word lines WL1 to WLn is selected, one page may be selected in the selected cell strings.

In another embodiment, even bit lines and odd bit lines may be provided instead of the first to mth bit lines BL1 to BLm. In addition, even-numbered cell strings among the cell strings CS11 to CS1m or CS21 to CS2m arranged in the row direction may be coupled to the even bit lines, respectively, and odd-numbered cell strings among the cell strings CS11 to CS1m or CS21 to CS2m arranged in the row direction may be coupled to the odd bit lines, respectively.

In an embodiment, at least one of the first to nth memory cells MC1 to MCn may be used as a dummy memory cell. For example, the at least one dummy memory cell may be provided to decrease an electric field between the source select transistor SST and the memory cells MC1 to MCp. Alternatively, the at least one dummy memory cell may be provided to decrease an electric field between the drain select transistor DST and the memory cells MCp+1 to MCn. When the number of dummy memory cells increases, the reliability of an operation of the memory block BLKa is improved. On the other hand, the size of the memory block BLKa increases. When the number of dummy memory cells decreases, the size of the memory block BLKa decreases. On the other hand, the reliability of an operation of the memory block BLKa may be deteriorated.

In order to efficiently control the at least one dummy memory cell, the dummy memory cells may have a required threshold voltage. Before or after an erase operation of the memory block BLKa, a program operation may be performed on all or some of the dummy memory cells. When an erase operation is performed after the program operation is performed, the threshold voltage of the dummy memory cells may control a voltage applied to the dummy word lines coupled to the respective dummy memory cells, so that the dummy memory cells can have the required threshold voltage.

Figure 5:
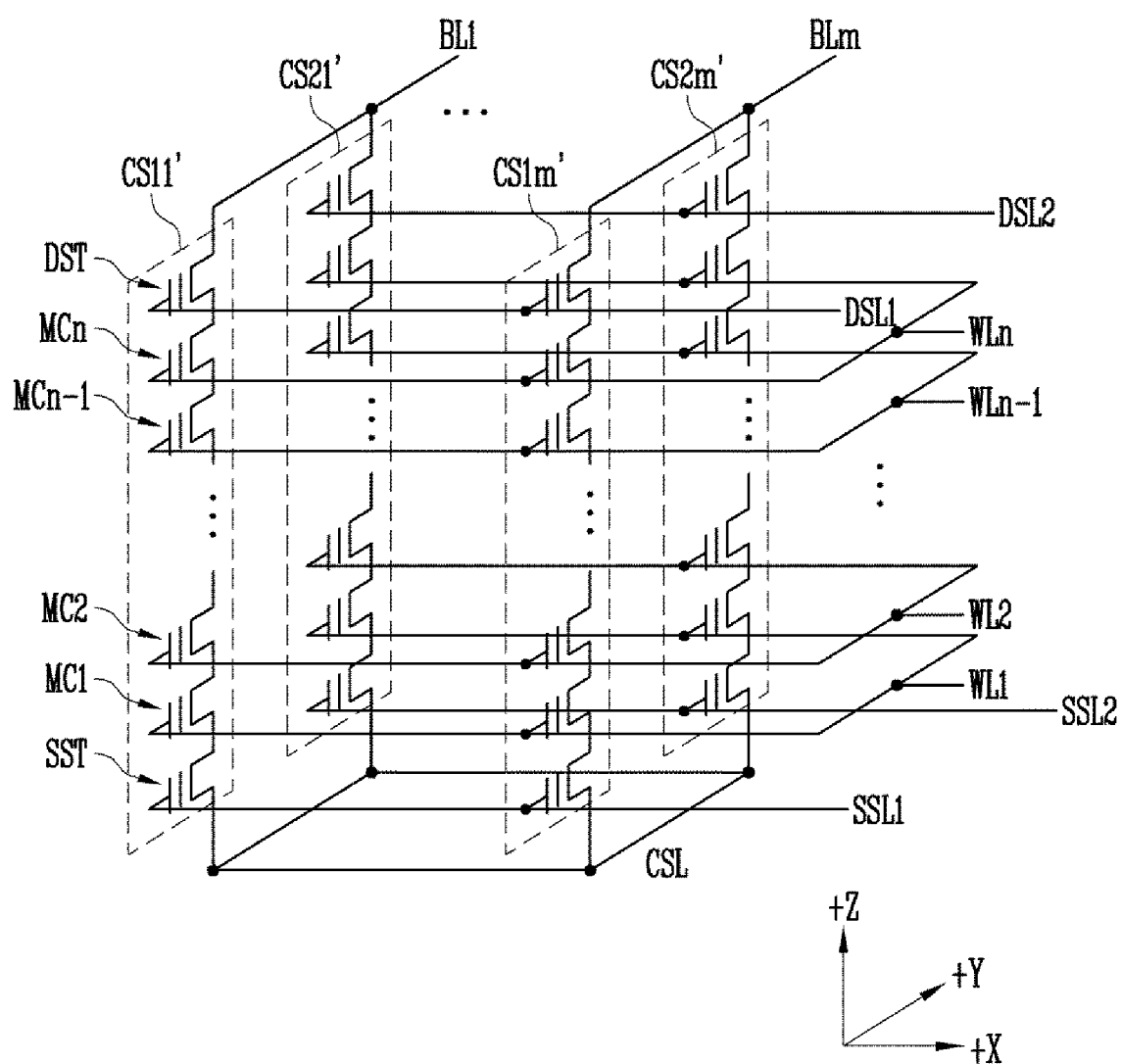
FIG. 5 is a circuit diagram illustrating a memory block, in accordance with another embodiment of the present invention disclosure.

FIG. 5 is a circuit diagram illustrating another example of a memory block in accordance with an embodiment of the present invention disclosure, for example, a memory block BLKb among the memory blocks BLK1 to BLKz of FIG. 3.

Referring to FIG. 5, the memory block BLKb may include a plurality of cell strings CS11' to CS1m' and CS21' to CS2m'. Each of the plurality of cell strings CS11' to CS1m' and CS21' to CS2m' extends along the +Z direction. Each of the plurality of cell strings CS11' to CS1m' and CS21' to CS2m' includes at least one source select transistor SST, first to nth memory cells MC1 to MCn, and at least one drain select transistor DST, which are stacked on a substrate (not shown) under the memory block BLKb.

The source select transistor SST of each cell string is coupled between a common source line CSL and the memory cells MC1 to MCn. The source select transistors of cell strings arranged on the same row are coupled to the same source select line. The source select transistors of the cell strings CS11' to CS1m' arranged on a first row are coupled to a first source select line SSL1. Source select transistors of the cell strings CS21' to CS2m' arranged on a second row are coupled to a second source select line SSL2. In another embodiment, the source select transistors of the cell strings CS11' to CS1m' and CS21' to CS2m' may be commonly coupled to one source select line. The first to nth memory cells MC1 to MCn of each cell string are coupled in series between the source select transistor SST and the drain select transistor DST. Gate electrodes of the first to nth memory cells MC1 to MCn are coupled to first to nth word lines WL1 to WLn, respectively.

The drain select transistor DST of each cell string is coupled between a corresponding bit line and the memory cells MC1 to MCn. The drain select transistors of cell strings arranged in the row direction are coupled to a drain select line extending in the row direction. The drain select transistors of the cell strings CS11' to CS1m' on the first row are coupled to a first drain select line DSL1. The drain select transistors of the cell strings CS21' to CS2m' on the second row are coupled to a second drain select line DSL2.

Consequently, the memory block BLKb of FIG. 5 has a circuit similar to that of the memory block BLKa of FIG. 4, except that the pipe transistor PT is excluded from each cell string in FIG. 5.

In another embodiment, even bit lines and odd bit lines may be provided instead of the first to mth bit lines BL1 to BLm. In addition, even-numbered cell strings among the cell strings CS11' to CS1m' or CS21' to CS2m' arranged in the row direction may be coupled to the even bit lines, respectively, and odd-numbered cell strings among the cell strings CS11' to CS1m' or CS21' to CS2m' arranged in the row direction may be coupled to the odd bit lines, respectively.

In an embodiment, at least one of the first to nth memory cells MC1 to MCn may be used as a dummy memory cell. For example, the at least one dummy memory cell may be provided to decrease an electric field between the source select transistor SST and the memory cells MC1 to MCn. Alternatively, the at least one dummy memory cell may be provided to decrease an electric field between the drain select transistor DST and the memory cells MC1 to MCn. When a larger number of dummy memory cells are provided, the reliability of an operation of the memory block BLKb is improved. On the other hand, the size of the memory block BLKb is increased. When the number of dummy memory cells decreases, the size of the memory block BLKb decreases. On the other hand, the reliability of an operation of the memory block BLKb may be deteriorated.

In order to efficiently control the at least one dummy memory cell, the dummy memory cells may have a required threshold voltage. Before or after an erase operation of the memory block BLKb, a program operation may be performed on all or some of the dummy memory cells. When an erase operation is performed after the program operation is performed, the threshold voltage of the dummy memory cells control a voltage applied to the dummy word lines coupled to the respective dummy memory cells, so that the dummy memory cells can have the required threshold voltage.

Figure 6:
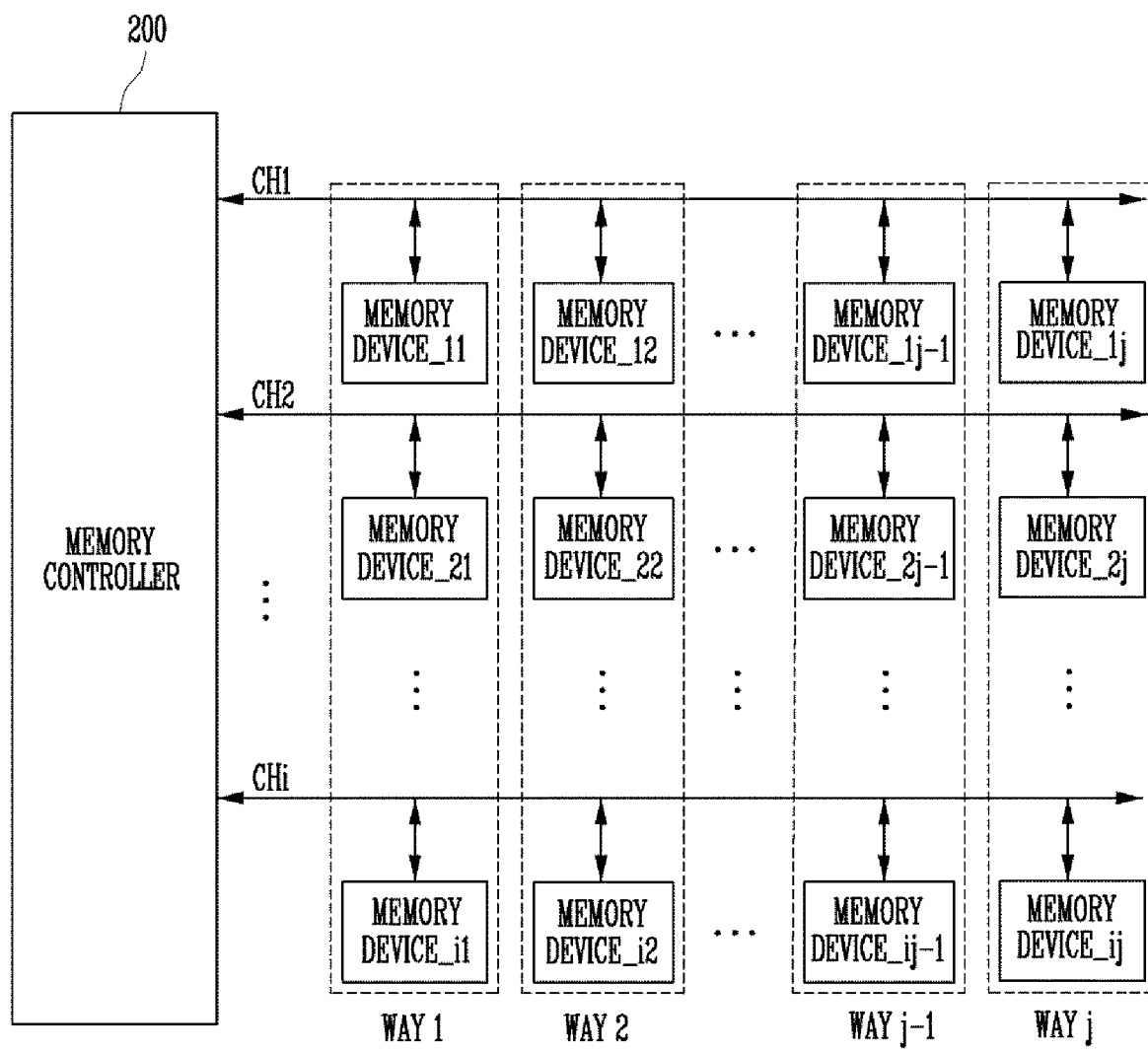
FIG. 6 is a diagram illustrating a coupling configuration between a memory controller and a plurality of memory devices, in accordance with an embodiment of the present invention disclosure.

FIG. 6 is a diagram illustrating a coupling configuration between a memory controller and a plurality of memory devices in accordance with an embodiment of the present invention disclosure, for example, between the memory controller 200 of FIG. 1 and a plurality of memory devices.

Referring to FIG. 6, the memory controller 200 may be coupled to a plurality of memory devices (e.g., memory device_11 to memory device_ij) through a plurality of channels CH1 to CHi. The number of channels and/or the number of memory devices coupled to each channel may be variously modified.

The memory device_11 to the memory device_1j may be commonly coupled to channel 1 CH1 and communicate with the memory controller 200 through the channel 1 CH1. Since the memory device_11 to the memory device_1j are commonly coupled to the channel 1 CH1, only one of these memory devices can communicate with the memory controller 200 at a time. However, operations may be simultaneously performed in more than one of the memory devices 11 to 1j.

Memory devices coupled to each of the remaining channels, i.e., channel 2 CH2 to channel i Chi may also operate in the same manner as the memory devices coupled to the channel 1 CH1.

In accordance with the present invention, the performance of a memory system employing a plurality of memory devices such as the one described in FIG. 2, may be improved using data interleaving. Data interleaving refers to data communication from the memory devices to the host, using the data interleaving method described herein. The data interleaving method of the present invention may include performing data read or write operation while moving between ways in a structure in which two or more ways share one channel. The data interleaving method may include managing the plurality of the memory devices which are coupled to the memory controller 200 in units of channels and ways. In order to maximize parallelism of the memory devices coupled to each channel (i.e., memory devices which are coupled to a single channel being able to perform simultaneous operations), the memory controller 200 may distribute and allocate consecutive logical memory areas to channels and ways.

For example, in accordance with an embodiment of the present invention, the memory controller 200 may transmit a command, a control signal including an address, and data to the memory device_11 through the channel 1 CH1. While the memory device_11 is programming the transmitted data in a memory cell included therein, the memory controller 200 may transmit a command, a control signal including an address, and data to the memory device_12.

The plurality of memory devices may be configured as a plurality of ways, e.g., as shown in FIG. 6, j ways WAY 1 to WAY j. Hence, Way 1 WAY 1 may include the memory devices from memory device_11 to memory device_i1. Memory devices included in way 2 WAY 2 to way j WAY j may also be configured in the same manner as the memory devices included in the way 1 WAY 1.

Each of the channels CH1 to CHi may be a bus for signals that are shared and used by memory devices coupled to the corresponding channel. Although FIG. 6 illustrates data interleaving in an i-channel/j-way structure, the efficiency of the data interleaving can be improved when the number of channels and the number of ways increase.

Figure 7A:
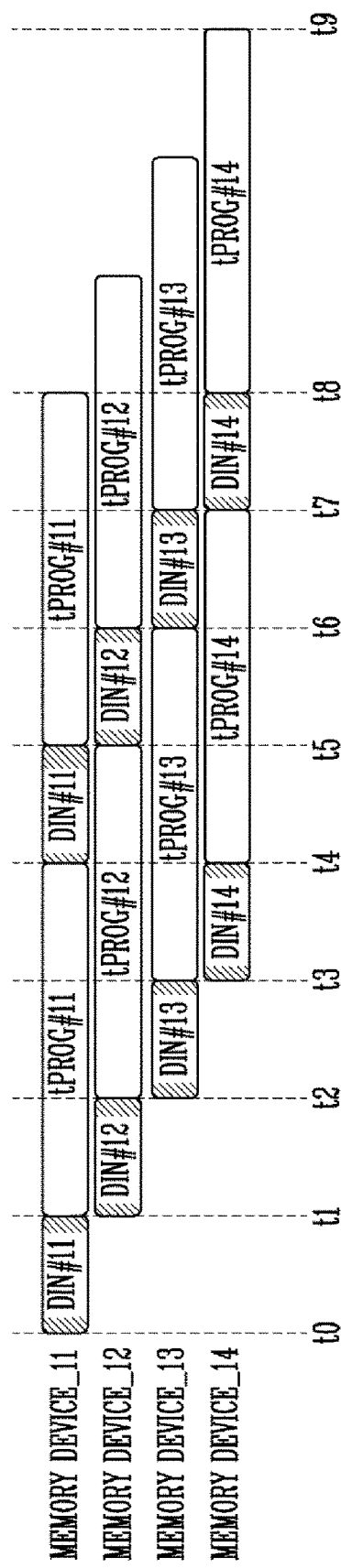
FIGS. 7A and 7B are timing diagrams illustrating a program operation and a read operation employing data interleaving.
Figure 7B:
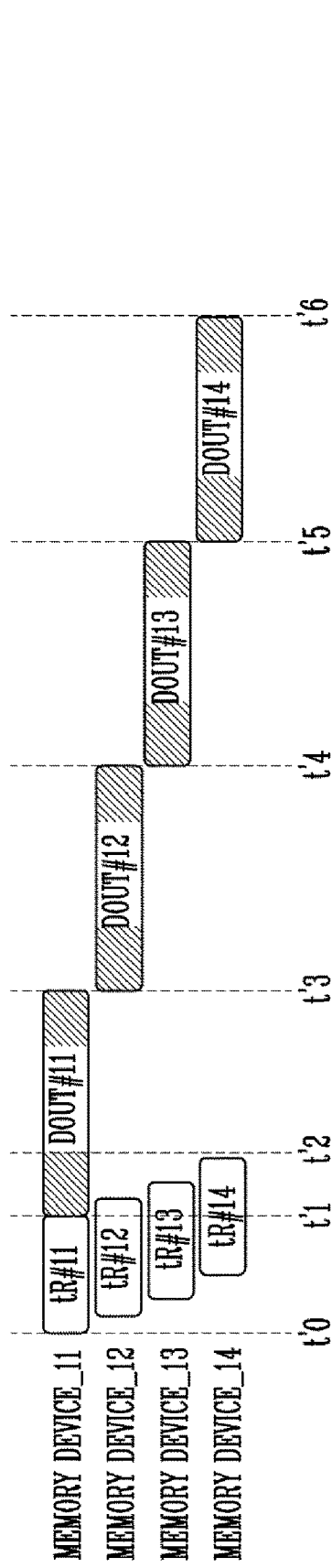

FIGS. 7A and 7B are timing diagrams illustrating a program operation and a read operation in accordance with an embodiment of the data interleaving method of the present invention.

FIG. 7A illustrates a program operation, and FIG. 7B illustrates a read operation.

In FIGS. 7A and 7B, for convenience, it is assumed that the program operation and the read operation are performed on memory device_11 to memory device_14 which are commonly coupled to the channel 1 CH1 of FIG. 6.

Referring to FIG. 7A, at a time period from t0 to t1, a data input DIN #11 may be performed on the memory device_11. The memory device_11 may receive a program command, an address, and data, which are input through the channel 1 CH1, while the data input DIN #11 is being performed. Since the memory device_11, the memory device_12, the memory device_13, and the memory device_14 are commonly coupled to the channel 1 CH1, the memory device_12, the memory device_13, and the memory device_14, which are the other memory devices, cannot use the channel 1 CH1 while the data input DIN #11 is being performed.

At a time period from t1 to t2, a data input DIN #12 may be performed on the memory device_12. The memory device_12 may receive a program command, an address, and data, which are input through the channel 1 CH1, while the data input DIN #12 is being performed. Since the memory device_11, the memory device_12, the memory device_13, and the memory device_14 are commonly coupled to the channel 1 CH1, the other memory devices, for example, the memory device_11, the memory device_13, and the memory device_14 cannot use the channel 1 CH1 while the data input DIN #12 is being performed. However, the memory device_11 has received the data at a time period from t0 to t1 (DIN #11), and therefore, a program operation may be performed from t1 (tPROG #11).

At a time period from t2 to t3, data input DIN #13 may be performed on the memory device_13. The memory device_13 may receive a program command, an address, and data, which are input through the channel 1 CH1, while the data input DIN #13 is being performed. Since the memory device_11, the memory device_12, the memory device_13, and the memory device_14 are commonly coupled to the channel 1 CH1, the other memory devices, for example, the memory device_11, the memory device_12, and the memory device_14 cannot use the channel 1 CH1 while the data input DIN #13 is being performed. However, the memory device_11 has received the data at a time period from t0 to t1 (DIN #11), and therefore, the program operation may be performed from t1 (tPROG #11). In addition, the memory device_12 has received the data at a time period from t1 to t2 (DIN #12), and therefore, a program operation may be performed from t2 (tPROG #12).

At the time period from time t3 to time t4, a data input DIN #14 may be performed on the memory device_14. The memory device_14 may receive a program command, an address, and data, which are input through the channel 1 CH1, while the data input DIN #14 is being performed. Since the memory device_11, the memory device_12, the memory device_13, and the memory device_14 are commonly coupled to the channel 1 CH1, the memory device_11, the memory device_12, and the memory device_13, which are the other memory devices, cannot use the channel 1 CH1 while the data input DIN #14 is being performed. However, the memory device_11 has received the data at a time period from t0 to t1 (DIN #11), and therefore, the program operation may be performed from t1 (tPROG #11). In addition, the memory device_12 has received the data at a time period from t1 to t2 (DIN #12), and therefore, the program operation may be performed from t2 (tPROG #12). In addition, the memory device_13 has received the data at a time period from t2 to t3 (DIN #13), and therefore, a program operation may be performed from t3 (tPROG #13).

At t4, the program operation of the memory device_11 may be completed (tPROG #11).

Subsequently, at the time period from time t4 to time t8, data inputs DIN #11, DIN #12, DIN #13, and DIN #14 may be performed on the memory device_11 to the memory device_14 in the same manner as those performed at t0 to t4.

Referring to FIG. 7B, at the time period from time t'0 to time t'2, each of the memory device_11 to the memory device_14 may internally read data corresponding to a specific address (tR #11 to tR #14). In an embodiment, the memory device_11 to the memory device_14 may read data in units of pages. The memory device_11 may read data for t'0 to t'1 (tR #11), and output the read data to the memory controller 200 through the channel 1 CH1 for time period from time t'1 to time t'3 (DOUT #11).

Since the memory device_11 outputs the data through the channel 1 CH1 at time period from time t'1 to time t'3 (DOUT #11), the memory device_12, the memory device_13, and the memory device_14 cannot use the channel 1 CH1.

At time period from time t'3 to time t'4, the memory device_12 may output read data to the memory controller 200 through the channel 1 CH1 (DOUT #12). Since the memory device_12 outputs the data through the channel 1 CH1 at time period from time t'3 to time t'4 (DOUT #12), the memory device_11, the memory device_13, and the memory device_14 cannot use the channel 1 CH1.

At time period from time t'4 to time t'5, the memory device_13 may output read data to the memory controller 200 through the channel 1 CH1 (DOUT #13). Since the memory device_13 outputs the data through the channel 1 CH1 at time period from time t'4 to time t'5 (DOUT #13), the memory device_11, the memory device_12, and the memory device_14 cannot use the channel 1 CH1.

At time period from time t'5 to time t'6, the memory device_14 may output read data to the memory controller 200 through the channel 1 CH1 (DOUT #14). Since the memory device_14 outputs the data through the channel 1 CH1 at time period from time t'5 to time t'6 (DOUT #14), the memory device_11, the memory device_12, and the memory device_13 cannot use the channel 1 CH1.

Figure 8:
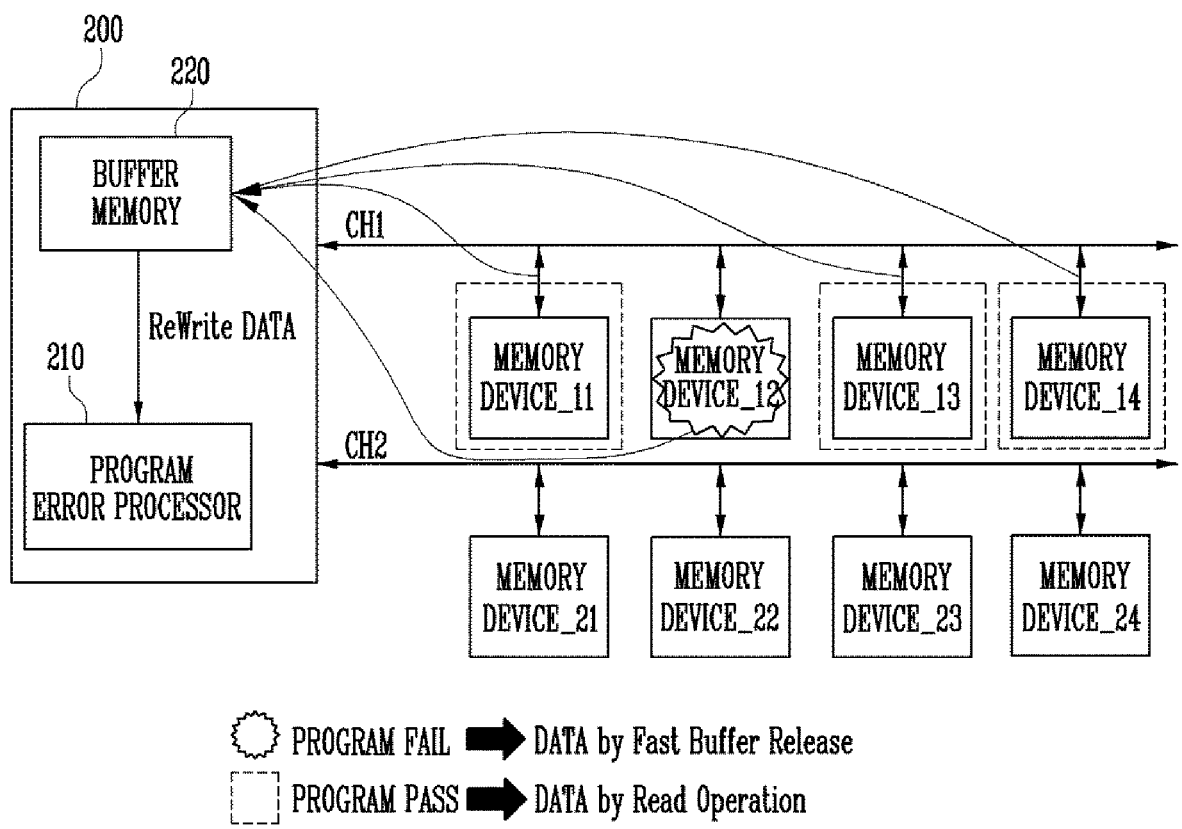
FIG. 8 is a diagram illustrating a method for processing a program operation fail, in accordance with an embodiment of the present invention disclosure.

FIG. 8 is a diagram illustrating a method for processing a program operation fail, in accordance with an embodiment of the present invention disclosure.

Referring to FIG. 8, the memory controller 200 may perform a program operation on the memory device_11 to the memory device_14, which are coupled to the channel 1 CH1, using the interleaving scheme described with reference to FIGS. 7A and 7B.

When the program operation is performed, program data stored in a buffer memory 220 may be stored in the memory device_11 to the memory device_14. The buffer memory 220 may store data, based on an index of a buffer memory (hereinafter referred to as "buffer memory index"). When the program operation is performed, the memory controller 200 may store a buffer memory index for data on which the program operation is to be performed for each memory device.

While the program operation is being performed, the program operation may fail in a specific memory device.

The program operation may fail due to various causes. When the program operation fails with respect to a memory device (hereinafter the fail memory device), the memory controller 200 may set, to a hold state, the channel coupled to a fail memory device (e.g., the memory device_12) that is a memory device in which the program operation fail occurs. While the channel is in the hold state, an additional program operation may be temporarily stopped.

A program error processor 210 may perform an operation to secure fail data that is data to be stored in the memory device in which the program operation fail occurs. For example, the program error processor 210 may provide a recall command with the fail memory device (e.g., the memory device_12).

In an embodiment, the recall command may be a fast buffer release command. When the recall command is provided to the memory device, the memory device may provide the program error processor 210 with fail data stored in a page buffer group (e.g., the page buffer group 123 of FIG. 2) included in the memory device.

Specifically, the program error processor 210 may input a recall command to a high priority queue (not shown), and provide the recall command to a memory device of which program operation has failed. When fail data is acquired according to the recall command, the memory controller 200 may release the hold state of the corresponding channel (e.g., CH1 of FIG. 8) (i.e., auto release).

When the hold state of the channel is released, program operations on the other memory devices may be performed without pause. For example, the memory controller 200 further includes a descriptor queue (not shown). The descriptor queue may include information on program operations to be performed by the memory devices. Except for a case where the high priority queue is operated, the program operations stored in the descriptor queue may be sequentially performed. Therefore, program operations of the other memory devices except for a memory device in which a program operation fail has occurred may be performed according to a previously written descriptor queue.

The program error processor 210 may acquire reprogram data from the memory devices in which the program operations have been normally performed. The reprogram data is data to be stored together with the fail data in the memory devices in which the program operations have been normally performed. For example, the program error processor 210 determines reprogram memory devices that are the memory devices in which the reprogram data is stored. Specifically, the program error processor 210 may determine reprogram memory devices, based on a buffer memory index. The reprogram memory devices may be memory devices that have normally completed a program operation on the reprogram data as data to be stored together with the fail data.

The program error processor 210 may acquire reprogram data by providing a read command to reprogram memory devices (e.g., the memory device_11, the memory device_13, and the memory device 14).

That is, the program error processor 210 may acquire the fail data of the fail memory device, using the recall command, and acquire the data stored in the reprogram memory devices, using the read command. In various embodiments, write data may be maintained in a write buffer (not shown) included in the memory controller 200 before a write operation is completed. The program error processor 210 may acquire the fail data of the fail memory device from the write buffer of the memory controller 200, without using the fail data of the fail memory device.

The program error processor 210 may align fail data and reprogram data, and perform a reprogram operation. In accordance with the embodiment of the present invention disclosure, data for the reprogram operation is acquired using a buffer memory index, so that a fail of the program operation may be processed regardless of how many bits memory cells included in the memory device store data of or how to perform interleaving.

Figure 9:
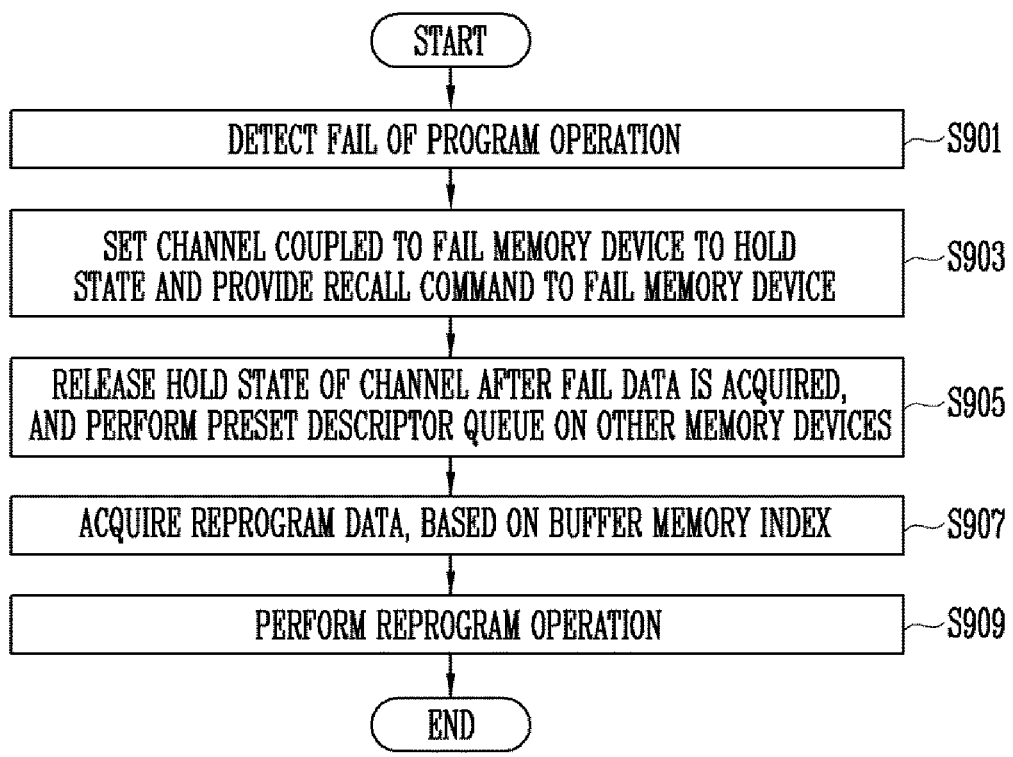
FIG. 9 is a flowchart illustrating an operation of a memory controller, in accordance with an embodiment of the present invention disclosure.

FIG. 9 is a flowchart illustrating an operation of a memory controller in accordance with an embodiment of the present invention disclosure, the memory controller 200 of FIG. 8.

Referring to FIG. 9, at step S901, the memory controller 200 detects a program operation fail.

At step S903, the memory controller 200 may provide a recall command to a memory device in which the program operation fail has occurred. Specifically, the memory controller 200 sets, to a hold state, a channel coupled to the memory device in which the program operation fail has occurred. The program operation is temporarily stopped for the time period that the channel is in the hold state.

In an embodiment, the recall command may be a fast buffer release command. When the recall command is provided to the memory device, the memory device may provide the memory controller 200 with fail data stored in the page buffer group included in the memory device.

At step S905, the memory controller 200 may acquire fail data and then release the hold state of the channel. After the hold state of the channel is released, the program operation may be performed on the other memory devices of the channel coupled to the fail memory device in which the program operation fail has occurred according to a preset descriptor queue.

At step S907, the memory controller 200 may determine reprogram memory devices as memory devices that store data to be stored together with the fail data, based on a buffer memory index stored in the program operation. The memory controller 200 may be acquired by providing a read command to the reprogram memory devices.

At step S909, the memory controller 200 may perform a reprogram operation, using the fail data and the reprogram data.

Figure 10:
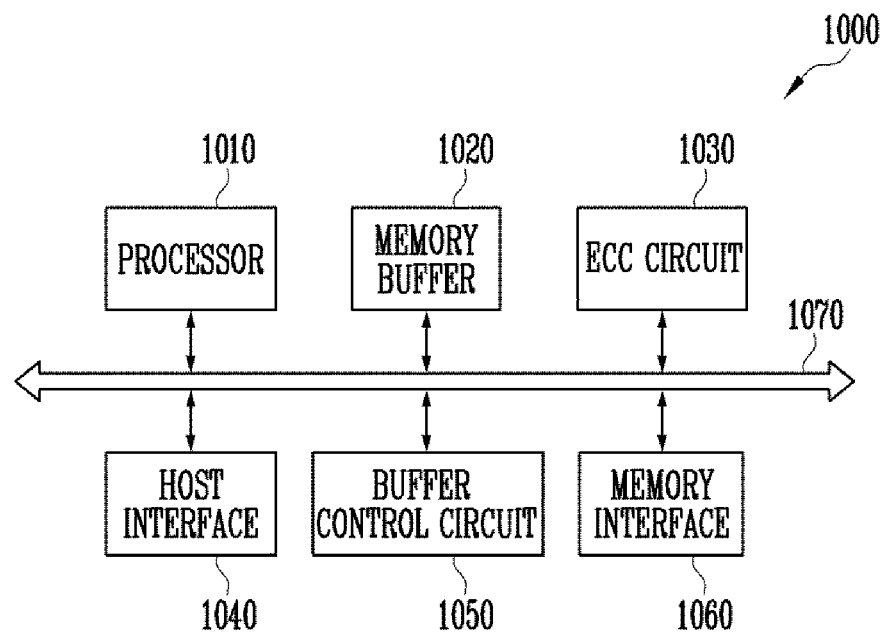
FIG. 10 is a diagram illustrating a memory controller, in accordance with an embodiment of the present invention disclosure.

FIG. 10 is a diagram illustrating a memory controller 1000 in accordance with an embodiment of the present invention disclosure. The memory controller 1000 may be the memory controller 200 of FIG. 1.

The memory controller 1000 is coupled to a host (e.g., a host 400 of FIG. 1) and a memory device (e.g., a memory device 100 of FIG. 1). The memory controller 1000 is configured to access the memory device in response to a request received from the host. For example, the memory controller 1000 controls read, program, erase, and background operations of the memory device. The memory controller 1000 is configured to provide an interface between the memory device and the host. The memory controller 1000 is configured to drive firmware for controlling the memory device.

Referring to FIG. 10, the memory controller 1000 may include a processor 1010, a memory buffer 1020, an error correction code (ECC) circuit 1030, a host interface 1040, a buffer control circuit 1050, a memory interface 1060, and a bus 1070.

The bus 1070 may be configured to provide channels between components of the memory controller 1000.

The processor 1010 may control an operation of the memory controller 1000, and perform a logical operation. The processor 1010 may communicate with the external host through the host interface 1040, and communicate with the memory device, for example, the memory device 100 of FIG. 1, through the memory interface 1060. Also, the processor 1010 may communicate with the memory buffer 1020 through the buffer control circuit 1050. The processor 1010 may control an operation of the memory system, for example, the memory system 50 of FIG. 1, using the memory buffer 1020 as a working memory, a cache memory or a buffer memory.

The processor 1010 may perform a function of a flash translation layer (FTL). The processor 1010 may translate a logical block address (LBA) provided by the host through the FTL into a physical block address (PBA). The FTL may receive an LBA, using a mapping table, to be translated into a PBA. Several address mapping methods of the FTL exist according to mapping units. A representative address mapping method includes a page mapping method, a block mapping method, and a hybrid mapping method.

The processor 1010 is configured to randomize data received from the host. For example, the processor 1010 may randomize data received from the host, using a randomizing seed. The randomized data is provided as data to be stored to the memory device to be programmed in the memory cell array.

In a read operation, the processor 1010 is configured to derandomize data received from the memory device. For example, the processor 1010 may derandomize data received from the memory device, using a derandomizing seed. The derandomized data may be output to the host.

In an embodiment, the processor 1010 may perform randomizing and derandomizing by driving software or firmware.

The memory buffer 1020 may be used as the working memory, the cache memory, or the buffer memory of the processor 1010. The memory buffer 1020 may store codes and commands, which are executed by the processor 1010. The memory buffer 1020 may include a static random access memory (RAM) (SRAM) or a dynamic RAM (DRAM).

The ECC circuit 1030 may perform an ECC operation. The ECC circuit 1030 may perform ECC encoding on data to be written in the memory device through the memory interface 1060. The ECC encoded data may be transferred to the memory device through the memory interface 1060. The ECC circuit 1030 may perform ECC decoding on data received from the memory device through the memory interface 1060. In an example, the ECC circuit 1030 may be included as a component of the memory interface 1060 in the memory interface 1060.

The host interface 1040 may communicate with the external host under the control of the processor 1010. The host interface 1040 may communicate with the host, using at least one of various communication manners, such as a universal serial bus (USB), a serial AT attachment (SATA), a high speed interchip (HSIC), a small computer system interface (SCSI), Firewire, a peripheral component interconnection (PCI), a PCI express (PCIe), a nonvolatile memory express (NVMe), a universal flash storage (UFS), a secure digital (SD), a multi-media card (MMC), an embedded MMC (eMMC), a dual in-line memory module (DIMM), a registered DIMM (RDIMM), and a load reduced DIMM (LRDIMM).

The buffer control circuit 1050 is configured to control the memory buffer 1020 under the control of the processor 1010.

The memory interface 1060 is configured to communicate with the memory device under the control of the processor 1010. The memory interface 1060 may communicate a command, an address, and data with the memory device through a channel.

In an example, the memory controller 1000 may not include the memory buffer 1020 and the buffer control circuit 1050.

In an example, the processor 1010 may control an operation of the memory controller 1000 by using codes. The processor 1010 may load codes from a nonvolatile memory device (e.g., a read only memory (ROM)) provided in the memory controller 1000. In another example, the processor 1010 may load codes from the memory device through the memory interface 1060.

In an example, the bus 1070 of the memory controller 1000 may include a control bus and a data bus. The data bus may be configured to transmit data in the memory controller 1000, and the control bus may be configured to transmit control information such as a command and an address in the memory controller 1000. The data bus and the control bus are separated from each other, and may not interfere or influence with each other. The data bus may be coupled to the host interface 1040, the buffer control circuit 1050, the ECC circuit 1030, and the memory interface 1060. The control bus may be coupled to the host interface 1040, the processor 1010, the buffer control circuit 1050, the memory buffer 1020, and the memory interface 1060.

Figure 11:
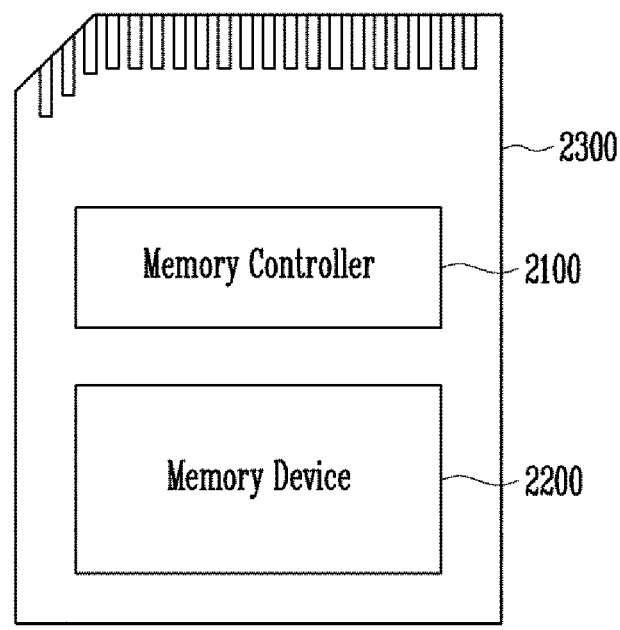
FIG. 11 is a block diagram illustrating a memory card system employing a memory system, in accordance with an embodiment of the present invention disclosure.

FIG. 11 is a block diagram illustrating a memory card system 2000 employing a memory system, in accordance with an embodiment of the present invention disclosure.

Referring to FIG. 11, the memory card system 2000 includes a memory controller 2100, a memory device 2200, and a connector 2300.

The memory controller 2100 is coupled to the memory device 2200. The memory controller 2100 is configured to access the memory device 2200. For example, the memory controller 2100 is configured to control read, write, erase, and background operations of the memory device 2200. The memory controller 2100 is configured to provide an interface between the memory device 2200 and a host (not shown). The memory controller 2100 is configured to driver firmware for controlling the memory device 2200. The memory device 2200 may be implemented identically to the memory device 100 described with reference to FIG. 1.

In an example, the memory controller 2100 may include components such as a random access memory (RAM), a processing unit, a host interface, a memory interface, and an error correction code (ECC) circuit.

The memory controller 2100 may communicate with an external device through the connector 2300. The memory controller 2100 may communicate with the external device (e.g., the host) according to a specific communication protocol. In an example, the memory controller 2100 may communicate with the external device through at least one of various communication protocols such as a universal serial bus (USB), multi-media card (MMC) an embedded MMC (eMMC), a peripheral component interconnection (PCI), a PCI express (PCI-e or PCIe), an advanced technology attachment (ATA), a serial-ATA (SATA), a parallel-ATA (PATA), a small computer system interface (SCSI), an enhanced small disk interface (ESDI), an integrated drive electronics (IDE), firewire, a universal flash storage (UFS), wireless fidelity (Wi-Fi), Bluetooth, and nonvolatile memory express (NVMe).

In an example, the memory device 2200 may be implemented with various nonvolatile memory devices such as an electrically erasable and programmable ROM (EPROM), a NAND flash memory, a NOR flash memory, a phase-change RAM (PRAM), a resistive RAM (ReRAM), a ferroelectric RAM (FRAM), and a spin torque transfer magnetic RAM (STT-MRAM).

The memory controller 2100 and the memory device 2200 may be integrated into a single semiconductor device, to constitute a memory card. For example, the memory controller 2100 and the memory device 2200 may constitute a memory card such as a PC card (Personal Computer Memory Card International Association (PCMCIA)), a compact flash (CF) card, a smart media card (e.g., SM and SMC), a memory stick, a multi-media card (e.g., MMC, RS-MMC, MMCmicro and eMMC), an SD card (e.g., SD, miniSD, microSD and SDHC), and a universal flash storage (UFS).

Figure 12:
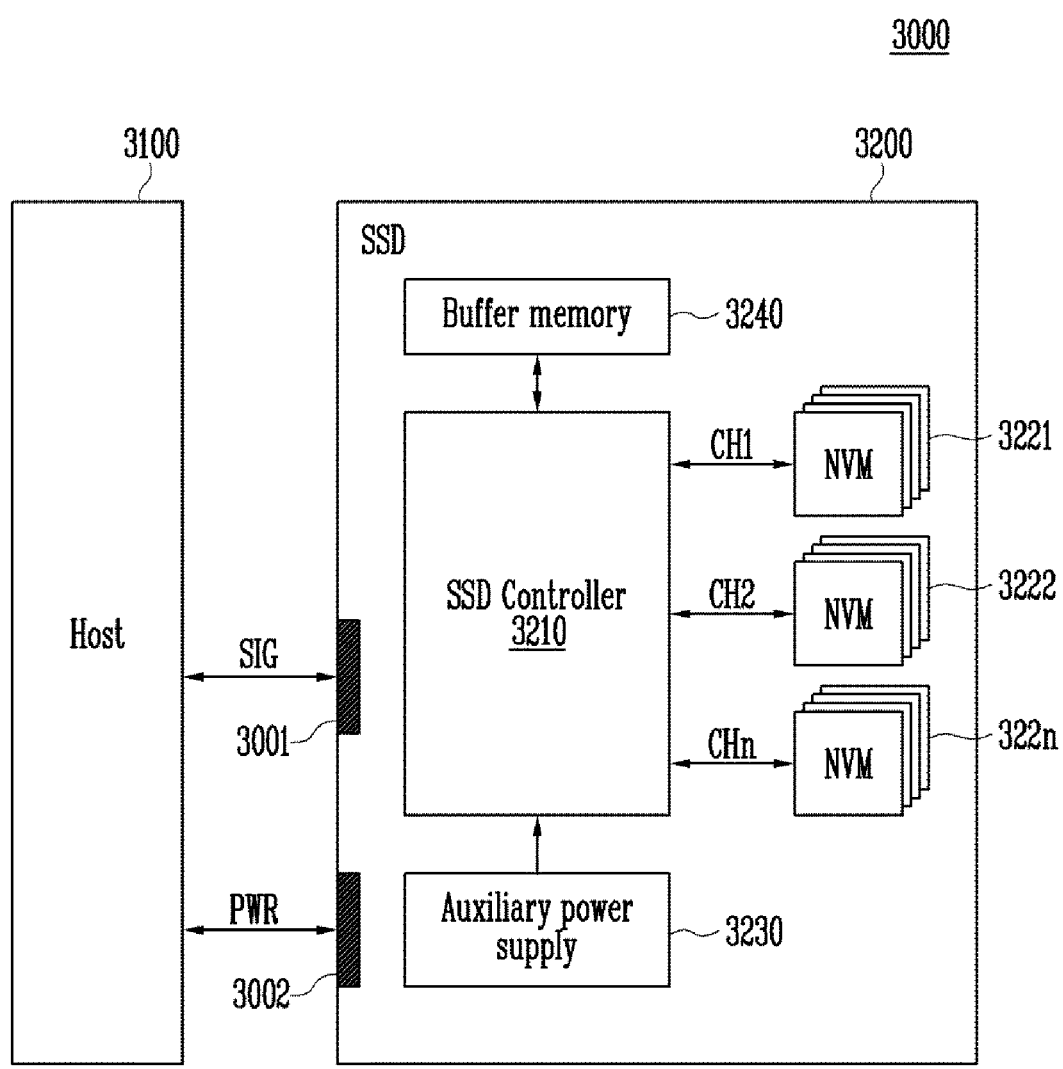
FIG. 12 is a block diagram exemplarily illustrating a solid state drive (SSD) system employing a memory system, in accordance with an embodiment of the present invention disclosure.

FIG. 12 is a block diagram exemplarily illustrating a solid state drive (SSD) system 3000 employing a memory system, in accordance with an embodiment of the present invention disclosure.

Referring to FIG. 12, the SSD system 3000 may include a host 3100 and an SSD 3200. The SSD 3200 may exchange a signal SIG with the host 3100 through a signal connector 3001, and may be provided with power PWR through a power connector 3002. The SSD 3200 includes an SSD controller 3210, a plurality of flash memories 3221 to 322*n*, an auxiliary power supply 3230, and a buffer memory 3240.

In an embodiment, the SSD controller 3210 may serve as the memory controller 200 described with reference to FIG. 1.

The SSD controller 3210 may control the plurality of flash memories 3221 to 322*n* in response to a signal SIG received from the host 3100. In an example, the signal SIG may be a signal based on an interface between the host 3100 and the SSD 3200. For example, the signal SIG is a signal defined by at least one of interfaces such as a universal serial bus (USB), multi-media card (MMC) an embedded MMC (eMMC), a peripheral component interconnection (PCI), a PCI express (PCIe), an advanced technology attachment (ATA), a serial-ATA (SATA), a parallel-ATA (PATA), a small computer system interface (SCSI), an enhanced small disk interface (ESDI), an integrated drive electronics (IDE), a firewire, a universal flash storage (UFS), a wireless fidelity (WI-FI), a Bluetooth, and an nonvolatile memory express (NVMe).

The auxiliary power supply 3230 is coupled to the host 3100 through the power connector 3002. When the supply of power from the host 3100 is not smooth, the auxiliary power supply 3230 may provide power of the SSD 3200. In an example, the auxiliary power supply 3230 may be located in the SSD 3200, or be located at the outside of the SSD 3200. For example, the auxiliary power supply 3230 is located on a main board, and provide auxiliary power to the SSD 3200.

The buffer memory 3240 operates as a buffer memory of the SSD 3200. For example, the buffer memory 3240 may temporarily store data received from the host 3100 or data received from the plurality of flash memories 3221 to 322*n*, or temporarily store meta data (e.g., a mapping table) of the flash memories 3221 to 322*n*. The buffer memory 3240 may include volatile memories such as a dynamic RAM (DRAM), a synchronous DRAM (SDRAM), a double data rate (DDR) SDRAM, a low power double data rate (LPDDR) SDRAM, and a graphic RAM (GRAM) or nonvolatile memories such as a ferroelectric RAM (FRAM), a resistive RAM (ReRAM), a spin transfer torque magnetic random access memory (STT-MRAM), and a phase-change RAM (PRAM).

Figure 13:
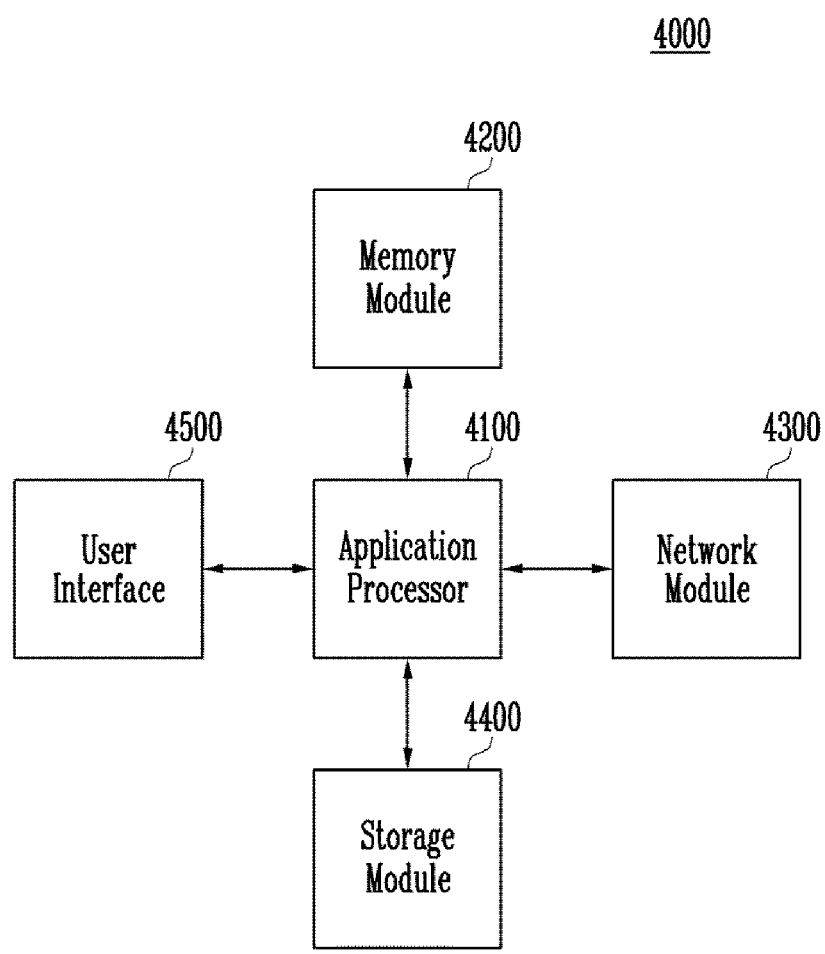
FIG. 13 is a block diagram illustrating a user system employing a memory system, in accordance with an embodiment of the present invention disclosure.

FIG. 13 is a block diagram illustrating a user system 40000 employing a memory system, in accordance with an embodiment of the present invention disclosure.

Referring to FIG. 13, the user system 4000 includes an application processor 4100, a memory module 4200, a network module 4300, a storage module 4400, and a user interface 4500.

The application processor 4100 may drive components included in the user system 4000, an operating system (OS), a user program, or the like. In an example, the application processor 4100 may include controllers for controlling components included in the user system 4000, interfaces, a graphic engine, and the like. The application processor 4100 may be provided as a system-on-chip (SoC).

The memory module 4200 may operate as a main memory, working memory, buffer memory or cache memory of the user system 4000. The memory module 4200 may include volatile random access memories such as a dynamic RAM (DRAM), a synchronous DRAM (SDRAM), a double data rate (DDR) SDRAM, a DDR2 SDRM, a DDR3 SDRAM, a low power double data rate (LPDDR) SDRAM, an LPDDR2 SDRAM, and an LPDDR3 SDRAM or nonvolatile random access memories such as a phase-change RAM (PRAM), a resistive RAM (ReRAM), a magneto-resistive RAM (MRAM), and a ferroelectric RAM (FRAM). In an example, the application processor 4100 and the memory module 4200 may be provided as one semiconductor package by being packaged based on a Package on Package (PoP).

The network module 4300 may communicate with external devices. In an example, the network module 4300 may support wireless communications such as Code Division Multiple Access (CDMA), Global System for Mobile communication (GSM), Wideband CDMA (WCDMA), CDMA-2000, Time Division Multiple Access (TDMA), Long Term Evolution (LTE), worldwide interoperability for microwave access (Wimax), wireless local area network (WLAN), ultra-wideband (UWB), Bluetooth, and wireless fidelity (Wi-Fi). In an example, the network module 4300 may be included in the application processor 4100.

The storage module 4400 may store data. For example, the storage module 4400 may store data received from the application processor 4100. Alternatively, the storage module 4400 may transmit data stored therein to the application processor 4100. In an example, the storage module 4400 may be implemented with a nonvolatile semiconductor memory device such as a phase-change RAM (PRAM), a magnetic RAM (MRAM), a resistive RAM (RRAM), a NAND flash, a NOR flash, or a NAND flash having a three-dimensional structure. In an example, the storage module 4400 may be provided as a removable drive such as a memory card of the user system 4000 or an external drive.

For example, the storage module 4400 may include a plurality of nonvolatile memory devices, and the plurality of nonvolatile memory devices may operate identically to the memory device described with reference to FIGS. 2 to 5. The storage module 4400 may operate identically to the memory system 50 described with reference to FIG. 1.

The user interface 4500 may include interfaces for inputting data or commands to the application processor 4100 or outputting data to an external device. In an example, the user interface 4500 may include user input interfaces such as a keyboard, a keypad, a button, a touch panel, a touch screen, a touch pad, a touch ball, a camera, a microphone, a gyroscope sensor, a vibration sensor and a piezoelectric element. The user interface 4500 may include user output interfaces such as a Liquid Crystal Display (LCD), an Organic Light Emitting Diode (OLED) display device, an Active Matrix OLED (AMOLED) display device, an LED, a speaker, and a motor.

In accordance with the present invention disclosure, there can be provided a memory system for processing a program operation fail and an operating method thereof.

While the present invention disclosure has been shown and described with reference to certain exemplary embodiments thereof, it will be understood by those skilled in the art that various changes in form and details may be made therein without departing from the spirit and scope of the present invention disclosure as defined by the appended claims and their equivalents. Therefore, the scope of the present invention disclosure should not be limited to the above-described exemplary embodiments but should be determined by not only the appended claims but also the equivalents thereof.

In the above-described embodiments, all steps may be selectively performed or part of the steps may be omitted. In each embodiment, the steps are not necessarily performed in accordance with the described order and may be rearranged. The embodiments disclosed in this specification and drawings are only examples to facilitate an understanding of the present invention disclosure, and the present invention disclosure is not limited thereto. That is, it should be apparent to those skilled in the art that various modifications can be made on the basis of the technological scope of the present invention disclosure.

Meanwhile, the exemplary embodiments of the present invention disclosure have been described in the drawings and specification. Although specific terminologies are used here, those are only to explain the embodiments of the present invention disclosure. Therefore, the present invention disclosure is not restricted to the above-described embodiments and many variations are possible within the spirit and scope of the present invention disclosure. It should be apparent to those skilled in the art that various modifications can be made on the basis of the technological scope of the present invention disclosure in addition to the embodiments disclosed herein.

What is claimed is:

1. A memory controller for controlling a plurality of memory devices commonly coupled to a channel, the plurality of memory devices respectively performing program operations, the memory controller comprising:
   a buffer memory configured to store data to be sequentially transferred to the channel based on a buffer memory index indicating an index of the buffer memory; and
   a processor configured to acquire fail data corresponding to a program operation fail and to acquire reprogram data to be transferred to the channel together with the fail data, according to the buffer memory index after receiving a fail signal from the channel,
   wherein the processor acquires the fail data and the reprogram data from the plurality of memory devices.

2. The memory controller of claim 1, wherein the processor aligns the fail data and the reprogram data and controls the plurality of memory devices to perform a reprogram operation.

3. The memory controller of claim 2, wherein the processor stores the fail data and the reprogram data in the buffer memory based on the buffer memory index of the fail data and the reprogram data.

4. The memory controller of claim 2, wherein the reprogram data comprises a plurality of pages.

5. The memory controller of claim 4, wherein the fail data comprises a plurality of pages.

6. The memory controller of claim 1, wherein the buffer memory stores the fail data and the reprogram data after the processor acquires the fail data and the reprogram data.

7. The memory controller of claim 1, wherein the processor receives the fail signal from a fail memory device in which a program operation has failed among the plurality of memory devices based on a result of a verify operation performed by the fail memory device.

8. The memory controller of claim 1, wherein the processor acquires the fail data from a fail memory device in which a program operation has failed among the plurality of memory devices.

9. The memory controller of claim 8, wherein the processor provides the fail memory device with a read command for acquiring the fail data.

10. The memory controller of claim 9, wherein the processor holds the channel to pause for the plurality of memory devices to perform the program operations before sending the read command to the fail memory device.

11. The memory controller of claim 8, wherein the processor releases the channel to continue for the plurality of memory devices to perform the program operations after acquiring the fail data.

12. The memory controller of claim 1, wherein the processor acquires the reprogram data from the buffer memory.

13. The memory controller of claim 1, wherein the processor acquires the reprogram data from a reprogram memory device among the plurality of memory devices.

14. A storage device, comprising:
a plurality of memory devices configured to be commonly coupled to a channel and to respectively perform program operations;
a buffer memory configured to store data to be sequentially transferred to the channel based on a buffer memory index indicating an index of the buffer memory; and
a memory controller configured to control the plurality of memory devices and the buffer memory and to acquire fail data corresponding to a program operation fail and to acquire reprogram data to be transferred to the channel together with the fail data, according to the buffer memory index after receiving a fail signal from the channel,
wherein the memory controller acquires the fail data and the reprogram data from the plurality of memory devices.

15. The storage device of claim 14, wherein the controller aligns the fail data and the reprogram data and controls the plurality of memory devices to perform a reprogram operation.

16. The storage device of claim 15, wherein the controller controls the buffer memory to store the fail data and the reprogram data in the buffer memory based on the buffer memory index of the fail data and the reprogram data.

17. The storage device of claim 14, wherein the buffer memory stores the fail data and the reprogram data after the controller acquires the fail data and the reprogram data.

18. The storage device of claim 14, wherein the controller receives the fail signal from a fail memory device in which a program operation has failed among the plurality of memory devices based on a result of a verify operation performed by the fail memory device.

19. The storage device of claim 14, wherein the controller acquires the fail data from a fail memory device in which a program operation has failed among the plurality of memory devices.

* * * * *